United States Patent
Mori et al.

(10) Patent No.: US 7,626,680 B2
(45) Date of Patent: Dec. 1, 2009

(54) EXPOSURE APPARATUS AND DEVICE FABRICATION METHOD USING THE SAME

(75) Inventors: Tetsuya Mori, Tochigi (JP); Yuichi Osakabe, Tochigi (JP); Tadayasu Nishikawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/140,628

(22) Filed: Jun. 17, 2008

(65) Prior Publication Data

US 2008/0252869 A1 Oct. 16, 2008

Related U.S. Application Data

(62) Division of application No. 10/938,356, filed on Sep. 9, 2004, now abandoned.

(30) Foreign Application Priority Data

Sep. 9, 2003 (JP) ............... 2003-316726

(51) Int. Cl.
  *G03B 27/68* (2006.01)
  *G03B 27/42* (2006.01)
(52) U.S. Cl. ......................... 355/52; 355/53
(58) Field of Classification Search .............. 355/53, 355/55, 75, 67, 52; 356/399, 400, 401; 250/548
See application file for complete search history.

(56) References Cited

U.S. PATENT DOCUMENTS 5,424,552 A 6/1995 Tsuji et al.
5,633,698 A 5/1997 Imai
6,262,792 B1 7/2001 Higashiki
2003/0016338 A1 1/2003 Yasuda et al.
2003/0184719 A1 10/2003 Shima et al.
2003/0197848 A1 10/2003 Shiraishi

FOREIGN PATENT DOCUMENTS

| EP | 1016781 A2 | 7/2000 |
| EP | 1341221 A1 | 9/2003 |
| JP | 10-092717 A | 4/1998 |
| JP | 11-045846 A | 2/1999 |

OTHER PUBLICATIONS

Partial European Search Report dated Nov. 20, 2008 issued by the European Patent Office in connection with application EP 04021381. 1, which a foreign counterpart to the present application. (4 pages provided).

Japanese Office Action dated Feb. 24, 2009 concerning Japanese patent application JP2003-316726 which a foreign counterpart of the instant application (Japanese language provided; 3 pages).

*Primary Examiner*—Peter B Kim
(74) *Attorney, Agent, or Firm*—Canon U.S.A., Inc. I.P. Division

(57) ABSTRACT

An exposure apparatus includes an original-form stage for holding an original form, a projection optical system for introducing light from the original form into an object to be exposed, and a detection optical system for detecting positions at plural points on the original form, in an optical-axis direction of the projection optical system, wherein a space for enclosing the original-form stage is different from a space for enclosing at least part of the detection optical system.

2 Claims, 13 Drawing Sheets

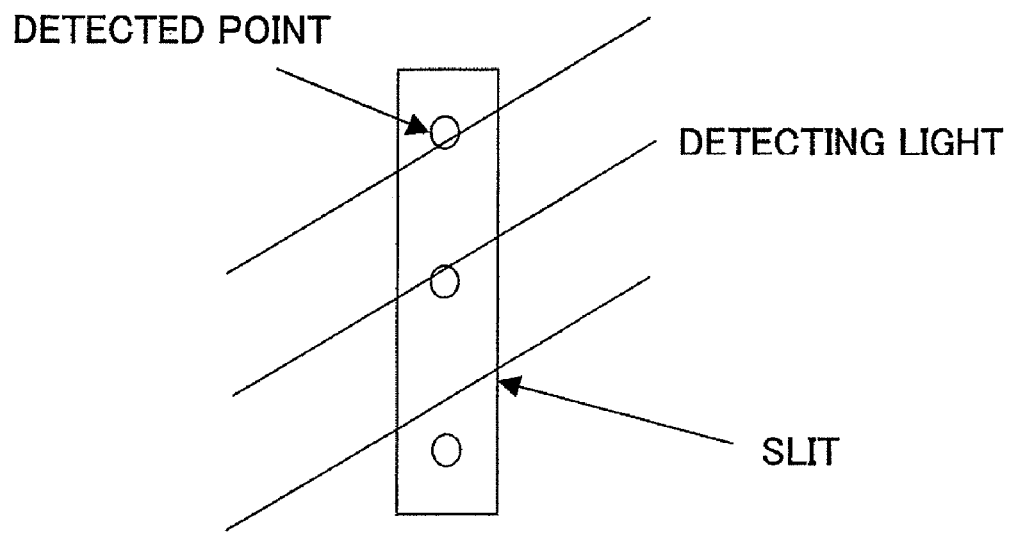
FIG. 16
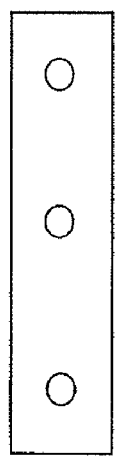 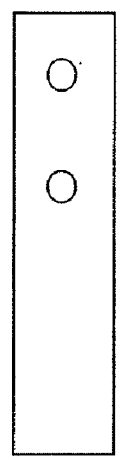 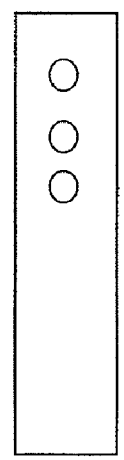
FIG. 17A  FIG. 17B  FIG. 17C

EXPOSURE APPARATUS AND DEVICE FABRICATION METHOD USING THE SAME

This is a divisional application of application Ser. No. 10/938,356 filed on Sep. 9, 2004, now abandoned to which priority under 35 U.S.C. §120 is claimed.

This application also claims a benefit of priority based on Japanese Patent Application No. 2003-316726 filed Sep. 9, 2003, which is incorporated by reference herein in its entirety.

BACKGROUND OF THE INVENTION

The present invention relates to an exposure apparatus used to expose a pattern on a reticle (or a mask) onto a plate, such as a wafer, in a lithography process for manufacturing a semiconductor device, a liquid crystal device, etc. The present invention is suitable, for example, for a scanning projection exposure apparatus that synchronously scans the photo-mask and the wafer relative to the projection optical system, in projecting a pattern on the mask onto the wafer.

The scanning projection exposure apparatus, such as a step-and-scan system, has been reduced to practice for the purpose of manufacturing semiconductor devices, as well as a cell projection type projection exposure apparatus, such as a stepper. A projection optical system in this type of projection optical system is required to have a resolving power close to the limit, and thus includes one or more units for measuring factors that affect the resolving power, such as the air pressure and the environmental temperature, and for correcting the imaging performance based on the measurement results. The high numerical aperture ("NA") of the projection optical system, which is set for the improved resolving power, consequently reduces the depth of focus, and thus requires an autofocus mechanism for measuring a focus position on a rough surface of a wafer as a plate (or a position in a direction of the optical axis of the projection optical system), and for positioning the wafer surface at the image surface of the projection optical system based on this measurement result.

However, imaging errors due to reticle's (or mask's) deformations cannot recently become ignorable gradually. For example, if the reticle's pattern surface deforms approximately uniformly toward the projection optical system, an average image-surface position lowers and the defocus occurs if the wafer focus position is the same. When the reticle's pattern surface deforms, positions on the pattern surface may deform in a direction perpendicular to the optical axis of the projection optical system, and the lateral offsets of the pattern causes distortion errors.

Conceivably, the factors of the reticle's deformations are classified into (a) the gravity deformation, (b) the flatness of the reticle pattern surface, and (c) the deformations caused by the flatness of the contact surfaces of the reticle and the reticle holder while the reticle is held by and absorbed on the reticle holder, which deformations include an inclusion of dust. For example, the deformation amount caused by these factors is as large as about 0.5 μm on the reticle, which corresponds to 30 nm on the wafer and cannot become ignored. The deformation amount should be measured at the measurement accuracy of about 0.1 μm. In addition, the reticle's deformation state differs according to reticles and reticle holders in the exposure apparatus. The measurement accuracy of the reticle's deformation amount is maintained when the reticle is actually absorbed on and held by the reticle holder in the projection exposure apparatus.

Accordingly, various methods for measuring the reticle's surface shape (surface position or deformation) have been conventionally proposed. See, for example, Japanese Patent Applications, Publication Nos. 6-36987, 7-272999, 7-86154, 8-264428, 9-180989, 10-214780, and 11-45846.

However, the conventional methods of measuring bows of the reticle use the measuring system and the reticle holder as separate members, bulking the apparatus. In addition, errors in the measuring system, which are hard to eliminate, cause the measurement errors and deteriorate the imaging performance. Moreover, since the measuring system measures a shape of the reticle surface not always at an exposure position, the measurement result does not always provide the intended imaging performance.

BRIEF SUMMARY OF THE INVENTION

Accordingly, it is an exemplified object of the present invention to provide an exposure apparatus and a device fabrication method using the same, which achieve the high imaging performance with a simple structure.

An exposure apparatus according to one aspect of the present invention includes an original-form stage for holding an original form, a projection optical system for introducing light from the original form into an object to be exposed, and a detection optical system for detecting positions at plural points on the original form, in an optical-axis direction of the projection optical system, wherein a space for enclosing the original-form stage is different from a space for enclosing at least part of the detection optical system.

Preferably, the exposure apparatus further includes a drive mechanism for driving the original-form stage, wherein an optical path of detecting light from the detection optical system to each of the plural points inclines, when viewed from the optical-axis direction of the projection optical system, relative to a drive direction in which the drive mechanism drives the original-form stage.

Preferably, the exposure apparatus is a scanning exposure apparatus for scanning the original-form stage in a scanning direction in exposure, wherein an optical path of detecting light from the detection optical system to each of the plural points inclines relative to the scanning direction, when viewed from the optical-axis direction of the projection optical system.

Preferably, the exposure apparatus is a scanning exposure apparatus for scanning the original-form stage in a scanning direction in exposure, wherein an optical path of detecting light from the detection optical system to each of the plural points is substantially parallel to the scanning direction, when viewed from the optical-axis direction of the projection optical system.

Preferably, the exposure apparatus further includes a drive mechanism for driving the original-plate stage, wherein when the exposure apparatus exposes, the exposure apparatus scans the original-plate stage using the drive mechanism, and detects surface positions of the original form using the detection optical system.

An exposure apparatus according to another aspect of the present invention includes a first movable stage for supporting and moving a first object, a second movable stage for supporting and moving a second object, a projection optical system for projecting a pattern on the first object onto the second object as a result of that the first and second movable stages are scanned in synchronization with the projection optical system, and a detector for scanning the first object and for detecting a surface shape of the first object, wherein the detector includes a driving part for scanning the first object before detecting an entire surface shape of the first object, and the first movable stage serves as the driving part. According to this exposure apparatus, the first movable part serves as the driving part of the detector, and contributes to the smaller size of the apparatus. For example, the first object is a reticle, and the first movable stage is a reticle stage. An arrangement of a detector at part of the reticle stage can accurately maintain a positional relationship when the reticle is scanned, improves the detection accuracy of the surface position of the reticle, and miniaturizes the apparatus. In a preferred embodiment, the first movable part, such as a reticle stage, has speed, acceleration and scanning range necessary for the scanning projection exposure as well as speed, acceleration and scanning range necessary for the detector of the first object, such as a reticle.

The detector may utilize an optically oblique incidence system, and an area for obliquely incident light of the optically oblique incidence system to detect the first object may intersect an area of the first object projected onto the second object by the projection optical system. Thereby, the surface shape of the first object is measured at the actual exposure position. For example, when the structure allows detections of the reticle's surface positions in the projection exposure area of the projection optical system, the reticle is detected over the entire reticle scanning area for scanning projection exposure. The scanning region of the reticle stage is minimized, and the reticle surface position can be detected at the actual scanning exposure positions.

The detector may include at least three or more detection points for detecting the surface shape of the first object in a non-scanning direction different from a scanning direction of the first movable stage. Detections at three or more points allow detections of inclinations and improve the accuracy. The detector may be located on part of a fixing board that drives the first movable stage. Thereby, the detector is provided on the fixer side.

The exposure apparatus may further include an alarm for alarming an exchange of the first object and a reset of the first object onto a holder for holding the first object, based on a detection result of the surface shape of the first object detected by the detector. The alarm can provide accurate exposure.

The exposure apparatus may further include a synchronous scanner for synchronously scanning the first and second movable stages relative to the projection optical system, and a controller for controlling the synchronous scanner based on a detection result of the surface shape of the first object detected by the detector. The controller can transfer the pattern on the first object onto the second object with high precision. The exposure apparatus may further include a controller for controlling a transfer by the projection optical system, based on a detection result of the surface shape of the first object detected by the detector. The controller can also transfer the pattern on the first object onto the second object with high precision.

An exposure apparatus according to another aspect of the present invention includes a projection optical system for projecting light from an object, a detector for detecting a surface shape of the object by scanning the object, and a movable stage for supporting the object, and for moving the detector and the object relative to each other when the detector detects the surface shape of the object. This exposure apparatus exhibits similar operations as those of the above exposure apparatus.

An exposure apparatus according to another aspect of the present invention includes a projection optical system for transferring a pattern on a reticle, and a detector for detecting a surface shape of the reticle by irradiating detecting light via a slit-shaped illuminated area, wherein the detector irradiates the detecting light in a direction parallel to a width direction of the slit-shaped illumination area. According to this exposure apparatus, the detector irradiates the detecting light parallel to the width direction of the slit-shaped illuminated area for miniaturization. The detector can maintain higher measurement accuracy caused by the fluctuations on the optical path than that for the irradiation of the detecting light in other directions, because the optical-path length of the detecting light can be shortened. For example, the detector may irradiate the detecting light parallel to the scanning direction of the reticle.

The detector may detect a shape of a pattern surface of the reticle, on which the pattern is formed. The exposure apparatus may be a scanning exposure apparatus. The detector may irradiate the detecting light in a direction parallel to a scanning direction of the reticle. The detector may irradiate the detecting light onto plural measurement points on the reticle, so as to detect inclinations and improve the detection accuracy.

An exposure apparatus of another aspect according to the present invention includes a projection optical system for transferring a pattern on an original form onto a photosensitive plate, an original-form stage for holding and moving the original form, the original-form stage including a movable part and a non-movable part, a reference original-form fixed on the original form or the original-form stage, and a surface position detector for obtaining information about surface positions of the original form or the reference original-form, wherein the surface position detector is formed on the non-movable part of the original-form stage, and at least part of the surface position detector is formed in a space substantially separated from a space that encloses the movable part of the original-form stage. Thus, the original-form surface-position detecting means is formed on the non-movable part of the original-form stage. Even if the space is narrow between the original-form stage and the projection optical system, the arrangement space can be maximized, since the original-form stage and the original-form surface-position detecting means are not formed separately. More specifically, in order to maintain the arrangement space of the original-form surface-position detecting means, a structure for operating the movable part is not formed on the entire surface of the non-movable part of the original-form stage in the inventive projection exposure apparatus. The original-form stage guide may be formed above and at both sides of the projection optical system. Since at least part of the surface-position detecting means is formed in a space substantially separated from a space that encloses the movable part of the original-form stage, the original-form surface-position detecting means can obtain the original-form surface-position information with high precision, because it is not affected by or it is less affected by the influence by the scanning action and heating source of the movable part of the original-form stage.

The surface position detector may obtain information about surface positions of the original form or the reference original-form in an optical-axis direction of the projection optical system, and include an oblique incidence optical system for irradiating light oblique to the optical-axis direction of the projection optical system, onto a pattern surface of the original form or a surface of the reference original-form at a side of the projection optical system, an incident direction of the irradiated light being substantially parallel to a moving direction of the original-form stage. The original-form surface-position detecting means obtain surface position information of the original form or the reference original-form in the optical-axis direction of the projection optical system. Since the incident direction of the illuminated light of the original-form surface-position detecting means is a scanning direction, the original-form surface-position detecting means can be simply and efficiently arranged without interference with the original-form stage guide structure or electric components.

At least part of the surface position detector may be located between the original-form stage and the projection optical system, in a space substantially separated from the space that encloses the movable part of the original-form stage or a space that encloses the projection optical system. Since the original-form surface-position detecting means is located in a space substantially separated from the space that encloses the movable part of the original-form stage and the space that encloses the projection optical system, the original-form surface-position detecting means is not affected by or less affected by the surrounding members and can obtain accurate original-form surface-position information.

An optical element substantially may separate a space that encloses at least part of the surface position detector from the space that encloses the movable part of the original-form stage, in a range in which the light should be transmitted, for example, a transmission range of the exposure light or the light of the original-form surface-position detecting means, etc. A shielding member, made of metal, resin, etc., can approximately separate the space outside this range.

An optical element may substantially separate a space that encloses at least part of the surface position detector from a space that encloses the projection optical system, in a range in which the light should be transmitted, for example, a transmission range of the exposure light or the light of the original-form surface-position detecting means, etc. A shielding member, made of metal, resin, etc., can approximately separate the space outside this range.

The exposure apparatus may further include an air-conditioner mechanism for individually air-conditioning at least one of a space that encloses at least part of the surface position detector and the space that encloses the movable part of the original-form stage. Since a space that encloses at least part of the surface position detector and the space that encloses the movable part of the original-form stage can be individually air-conditioned, the air-conditioning of the space that encloses the movable part of the original-form stage, the heating source of the movable part of the original-form stage, the driving condition of the movable part of the original-form stage do not affect or less affects the original-form surface-position detecting means. In addition, in air-conditioning the space that encloses at least part of the original-form surface-position detecting means, it is possible to reduce the influence of the measurement error factor from the neighborhood of the original-form surface-position detecting means.

The exposure apparatus may further include an air-conditioner mechanism for individually air-conditioning at least one of a space that encloses at least part of the surface position detector and a space that encloses the projection optical system. Since a space that encloses at least part of the surface position detector and a space that encloses the projection optical system can be individually air-conditioned, an optimal atmosphere can be formed in each space for the good measurement accuracy and exposure performance.

A device fabrication method according to still another aspect of the present invention includes the steps of exposing an object using the above exposure apparatus, and developing the object that has been exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BRIEF DESCRIPTION OF THE DRAWINGS

FIG. 16 is a schematic perspective view showing detecting light in the inventive exposure apparatus.

FIG. 17 is a schematic plane view showing a detected point of a reticle used for the inventive exposure apparatus.

DETAILED DESCRIPTION OF THE PREFERRED EMBODIMENTS

Figure 1:
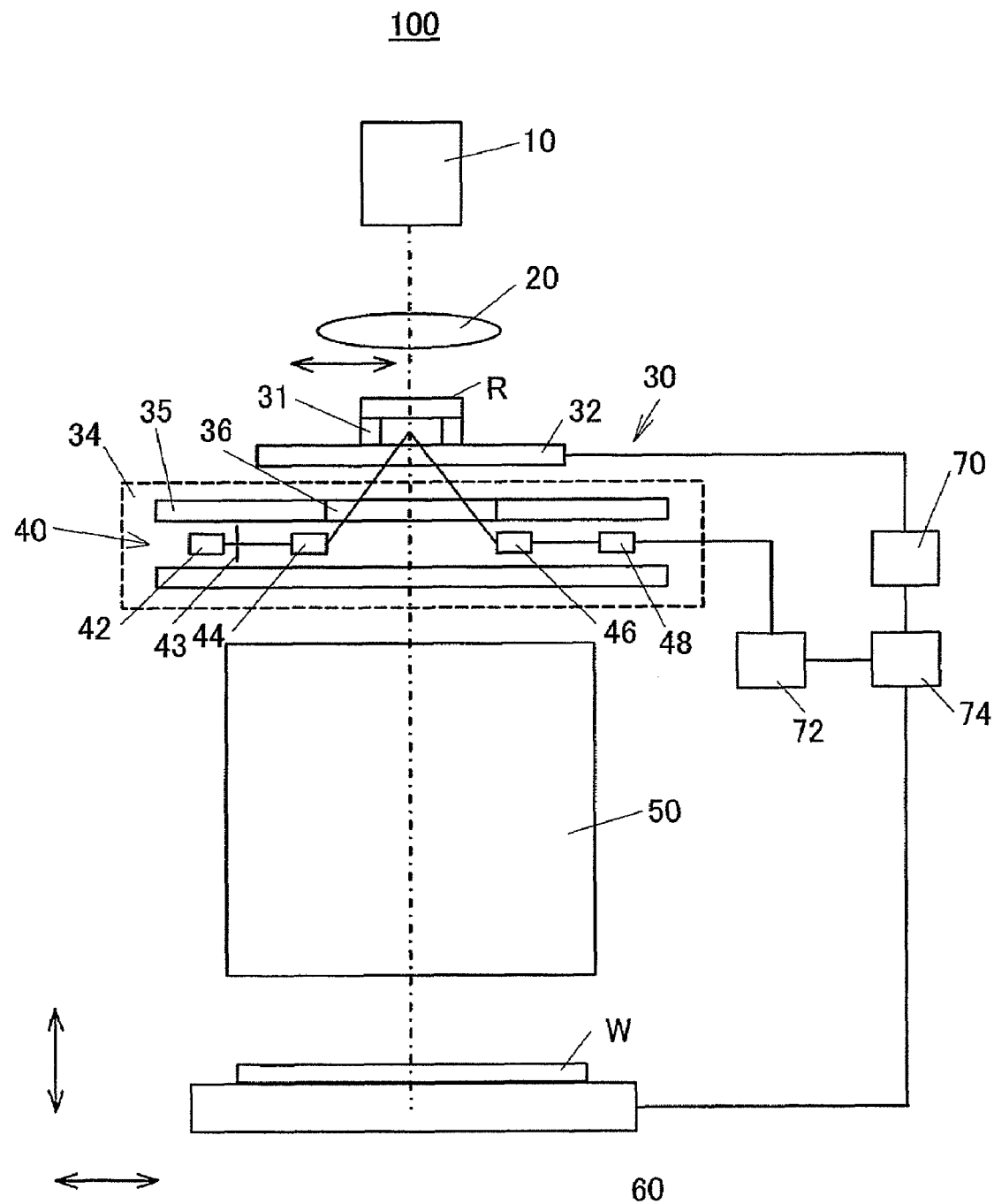
FIG. 1 is a schematic sectional view of an exposure apparatus according to a first embodiment of the present invention.

A description will now be given of the embodiments of the present invention with reference to the accompanying drawings.

First Embodiment

A description will now be given of an exposure apparatus 100 according to one embodiment of the present invention, with reference to FIG. 1. The exposure apparatus 100 is a scanning projection exposure apparatus. The "step-and-scan manner", as used herein, is a projection exposure method that exposes a pattern on a mask or a reticle onto a wafer by continuously scanning the wafer relative to the mask or reticle, and by moving, after a shot of exposure, the wafer stepwise to the next exposure area to be shot.

The exposure apparatus 100 includes a light source unit 10, an illumination optical system 20, a reticle stage 30, a detecting system 40, a projection optical system 50, a wafer stage 60, a controller 70, a memory 72, and an operation section 74.

The light source unit 10 uses, for example, an ArF excimer laser with a wavelength of approximately 193 nm, and a KrF excimer laser with a wavelength of approximately 248 nm, and a $F_2$ laser with a wavelength of approximately 157 nm. Of course, a type of laser is not limited to excimer laser, a YAG laser, for example, may be used. Similarly, the number of laser units is not limited. When the light source unit 10 uses a laser, it is desirable to employ a beam shaping optical system that shapes a parallel beam from a laser source to a desired beam shape, and an incoherently turning optical system that turns a coherent laser beam into an incoherent one. A light source applicable to the light source unit 10 is not limited to a laser, and may use one or more lamps such as a mercury lamp and a xenon lamp.

The illumination optical system 20 is an optical system that illuminates the reticle R, and includes a lens, a mirror, a light integrator, a stop, and the like, for example, a condenser lens, a fly-eye lens, an aperture stop, a condenser lens, a slit, and an imaging optical system in this order. The illumination optical system 20 can use any light whether it is axial or non-axial light. The light integrator may include a fly-eye lens or an integrator formed by stacking two sets of cylindrical lens array plates (or lenticular lenses), and be replaced with an optical rod or a diffractive element.

The reticle R forms a circuit pattern (or an image) to be transferred, and diffracted light emitted from the reticle R is projected onto the plate 740 via the projection optical system 40. The reticle R and the wafer W are located in an optically conjugate relationship. The scanning projection exposure apparatus 100 of the instant embodiment synchronously scans the reticle R and the wafer W to transfer a pattern on the reticle R to the wafer W.

The reticle R is placed on a reticle stage 30. The reticle stage 30 includes a reticle holder 31, a movable part 32, and a fixed part 34, and holds the reticle R so that it can scan the reticle R in the Y direction using a linear motor (not shown). A dust shielding film or pellicle is provided on a metal frame at a lower side of the reticle R, although omitted in FIG. 1.

In FIG. 1, the reticle R is held on the movable part 32 of the reticle stage 30 by vacuum absorption by the reticle holder 31, and can be scanned in a direction orthogonal to the paper while the pattern surface of the reticle R faces down. In the scanning projection exposure, the movable part 32 of the reticle stage 30 moves in the left and right directions shown by an arrow in the paper so as to project the entire pattern surface of the reticle R.

The detecting system 40 detects the surface shape of the reticle R, and is incorporated into the fixed part 34 of the reticle stage 30, such as a fixation board having a guide. As shown in FIG. 1, the detecting system 40 in the fixed part 34 detects a surface shape of the reticle R via an opening 36 formed in a top cover 35 of the fixed part 34. The opening 36 may be a perforated or made of a material, such as glass, that transmits the light of the detecting system 40. The opening 36 may be smaller for the purpose of the scanning projection exposure, but is made larger for the light of the detecting system 40. An opening for the scanning projection exposure and an opening to detect a surface shape of the reticle R can be provided separately. More specifically, a detection of one point on the reticle needs an opening for the detecting light incident upon one point on the reticle and an opening for the detecting light exiting from the one point on the reticle. Therefore, when there are three light irradiation sections, which will be described later, seven openings that include six openings for detecting the surface shape of the reticle R and one opening for the exposure light for the scanning exposure.

The detecting system 40 has a structure and function similar to those of an oblique incidence type focus sensor for positioning an exposed surface of the wafer W at an imaging surface of the projection optical system 50. The detecting system 40 includes a light irradiation section and an optical detector section. The light irradiation section includes, as principal components, a light source 42, such as a light-emitting diode, a projection-mark slit 43, and a projection lens 44. The optical detector section includes, as principal components, a light-receiving lens 46, and a detector 48, such as a CCD sensor. FIG. 1 shows only one light irradiation section and only one optical detector, the instant embodiment actually arranges three each. For example, three light sources 42 are provided, or rays from one light source are obliquely irradiated upon three spots on the reticle via three projection-mark slits and three projection lenses. Each element in the detecting system 40 can apply any structure known in the art, and a detailed description will be omitted.

Figure 2:
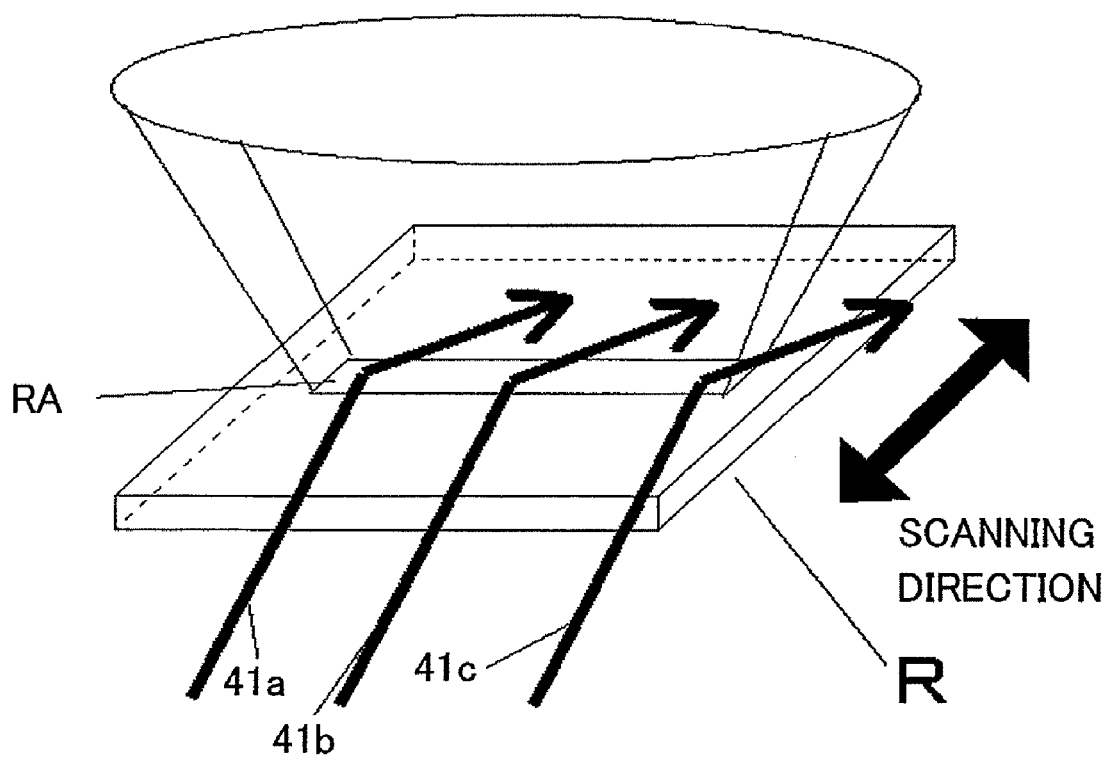
FIG. 2 is an enlarged perspective view near a reticle stage shown in FIG. 1.

When the detecting system 40 detects surface positions on the entire pattern surface of the reticle R, it scans the movable part 32 of the reticle stage 30, similar to the scanning projection exposure. As shown in FIG. 2, which will be described later, the detecting system 40 can irradiate three or more detecting rays 41a to 41c in a direction orthogonal to the paper surface (or the direction orthogonal to the scanning direction of the reticle R or in other words a direction orthogonal to the slit's longitudinal direction or a direction approximately perpendicular to the reticle or a direction substantially parallel to the scanning direction when viewed from the optical-axis direction). Similar to the prior art, the detecting system 40 detects surface positions for the non-scanned area of the reticle R. Three or more rays of detecting light can detect the inclinations of the reticle R and improve the detection accuracy. Use of these three or more rays of detecting light to detect three positions on the reticle R along the slit's longitudinal direction can accurately measure the surface deformations, etc. in the reticle R's longitudinal direction.

It is important in the instant embodiment that the reticle stage 30 be optimized for the scan driving for both the projection exposure and the reticle surface position detections. The reticle stage 30 is adapted to provide stable control over the reticle R in the scan driving through common use of the necessary scan speed and acceleration without simply using the same scan direction. The fixed part 34 of the reticle stage 30 is designed to have sufficient rigidity, with respect to a thickness, etc., to support the detecting system 40.

The instant embodiment arranges the detecting system 40 in the reticle stage 30, and is advantageously insensitive to variations of a relative positional relationship during the scan driving and with time. If the detecting system and the reticle stage are separate members as in the prior art, it would be difficult to adjust the optical axis of the detecting system 40 and a position of the reticle R held by the reticle stage 30, and an incident angle of the light. In addition, the variability with time would disadvantageously change the relative relationship and deteriorate the accuracy. However, the instant embodiment integrates the detecting system 40 with the reticle stage 30 (by fixing the detecting system 40 onto the fixed part of the reticle stage 30), facilitates an adjustment of the relative relationship at the time of unit assembly, reduces the variability with time, and provides accurate detections of the reticle's surface positions.

Preferably, detection positions of the pattern surface of the reticle R detected by the detecting system 40 approximately accords with positions projected by the projection optical system 50, as shown in FIG. 2. Here, FIG. 2 is a schematic perspective view showing a relationship between an illuminated area RA on the reticle R and rays incident upon the reticle R from the detecting system 40.

This corresponds to FIG. 1 where the optical axis of the projection optical system 50 intersects with the detecting light of the detecting system 40 on the pattern surface of the reticle R. Actually, the projection exposure area has a width of several millimeters to several dozens of millimeters in the left and right direction with respect to the optical axis, and the same length as that of the projection exposure area on the reticle pattern surface in the direction orthogonal to the paper surface, or the length of the area in which the pattern to be projected is formed. The small scanning region and the simple structure of the reticle stage 30 and the small size of the entire apparatus are available, if the illuminated area RA on the reticle is adjusted to include or be as equal as the detection area whose surface positions are detected by the detecting system 40 on the reticle pattern surface or the detected area is equal to the projection exposure area. The instant embodiment adjusts a position on the reticle at which the detecting system 40 irradiates the detecting light so that the position offsets from a direction orthogonal to the scanning direction and overlaps the scanning direction. A shape of the illuminated area RA may be an arc shape, which may not include the optical axis of the projection optical system, and another shape.

This configuration the reticle surface position to be detected at a scanning projection exposure position, and provides a precise error detection of a reticle surface position that does not contain a positional orientation error of the reticle stage 30. The detection error of a reticle surface position otherwise occurs and results from the positional orientation error of the reticle stage 30, when the detection area of the detecting system 40 differs from the scanning projection exposure area.

The projection optical system 50 projects a pattern on the reticle surface illuminated by the exposure light from the illumination optical system 20 at a predetermined magnification, such as 1/4 or 1/5, onto a wafer surface, which will be described later. The projection optical system 50 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

A photoresist is applied to the wafer W. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic coating such as HMDS (Hexamethyl-disilazane). The pre-bake treatment is a baking (or burning) step, softer than that after development, which removes the solvent.

The wafer W is mounted on the wafer stage 60 that can move and incline in XYX directions for scanning exposure of the entire surface of the wafer and for focus corrections. The wafer stage 60 may use any structure known in the art, and a detailed description of its structure and operation is omitted. The wafer stage 60 may use, for example, a linear motor to move the wafer W. The reticle R and wafer W are scanned synchronously, and the positions of the reticle stage 30 and the wafer stage 60 are monitored, for example, by a laser interferometer and the like, so that both are driven at a constant speed ratio. The wafer stage 30 is installed on a stage stool supported on the floor and the like, for example, via a damper.

The controller 70 controls each component, and corrects based on the surface position of the reticle R detected by the detecting system 40. The correction system can use any method known in the art, and a detailed description thereof will be omitted. A typical correction means is to correct a scanning position of the wafer stage 60 or a position in a height direction or an inclination in accordance with the surface shape, to correct an image surface shape to a shape corresponding to a reticle pattern surface shape by driving an optical element in the projection optical system, and to correct the reticle surface shape itself.

Prior to exposure, the detecting system 40 measures the entire surface shape of the reticle R by scanning it. Since the reticle stage 30 scans the reticle both at the scanning projection exposure and at the time of detection of a reticle surface position, the instant embodiment can provide an efficient and space-saving scanning exposure apparatus. In addition, the detecting system 40 formed as part of the reticle stage 30 can provide stable detections in scanning the reticle, precisely detect reticle surface positions, and accurately achieve the scanning projection exposure in accordance with the detected reticle surface position.

An arrangement that approximately accords a position of the reticle pattern surface, to be detected by the detecting system 40, with a position projected by the projection optical system 50 reduces the scanning range of the reticle stage 30, and provides a simple structure of the reticle stage 30 and a small apparatus. As a result, the instant embodiment provides a precise error detection of a reticle surface position that does not contain a positional orientation error of the reticle stage 30. The detection error of a reticle surface position otherwise occurs and results from the positional orientation error of the reticle stage 30, when the detection area of the detecting system 40 differs from the scanning projection exposure area.

The memory 72 stores a surface shape detected by the detecting system 40, and the operation part 74 calculates an approximate entire surface of the reticle R. The deformation information in the scanning direction is sent to the wafer stage 60, and used for corrections so that the focus drive amount becomes optimal at the scanning exposure time. Alternatively, when it is determined based on the measurement result of the reticle's surface shape that the exposure imaging performance would deteriorate, the controller 70 sends a signal to the reticle stage 30, and the signal serves as an alarm means for prompting a user to exchange and reset the reticle.

In exposure, the light emitted from the light source unit 10 enters the illumination optical system 20 and uniformly illuminates the reticle R. A pattern on the reticle R is projected onto the wafer W by the exposure light and the projection optical system 50. Each shot is exposed by scanning the reticle R and the wafer W relative to each other in a direction orthogonal to the paper surface. In other words, the light irradiation section irradiates the detecting light onto the pattern surface on the reticle, and the optical detector section detects the reflected light to detect a surface position of the reticle. The controller 70 corrects the deformation of the reticle R based on the surface shape of the reticle R, and accurately transfers the pattern onto the resist, providing high-quality devices, such as a semiconductor device, a LCD device, an image pickup device (e.g., a CCD, a thin-film magnetic head.

Second Embodiment

Figure 3:
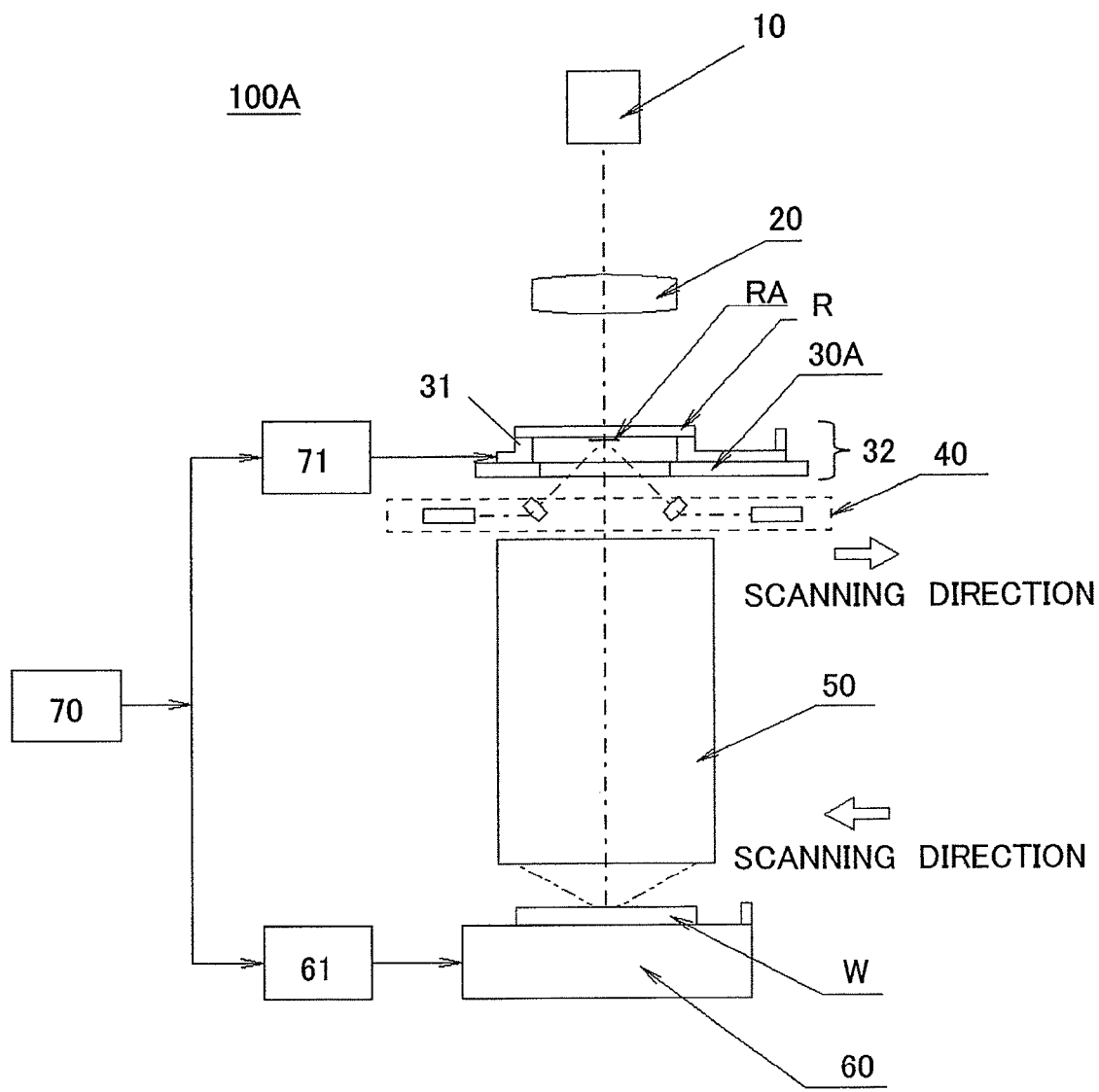
FIG. 3 is a schematic sectional view of an exposure apparatus according to a second embodiment of the present invention.

A description will be given of an exposure apparatus 100A according to a second embodiment of the present invention, with reference to FIG. 3. Those elements in FIG. 3 which are corresponding elements in FIG. 3 are designated by the same reference numerals, and a duplicate description thereof will be omitted. Similar to FIG. 1, the light source unit 10 and the illumination optical system 20 illuminate the rectangular or arc-shaped illuminated area RA on the reticle R at the approximately uniform light intensity, and the projection optical system 50 transfers a circuit pattern image in the slit-shaped illuminated area RA on the reticle R onto the wafer W as an object to be exposed.

The reticle R is held by a reticle stage 30A. The controller 70 drives the reticle stage 30A via a reticle stage driver 71. The driver 71 drives the movable part 32. Suppose that, within a two-dimensional plane perpendicular to the optical axis of the projection optical system 50, a +X or −X direction is defined as a scanning direction of the reticle R relative to the slit-shaped illuminated area RA, and a Z direction is defined as a direction parallel to the optical axis of the projection optical system 50. A wafer feed system (not shown) feeds the wafer W to the wafer stage 60, and the wafer chuck etc. (not shown) holds the wafer on the wafer stage. A wafer stage driver 61 allows the wafer stage 60 to position the wafer W within the plane perpendicular to the optical axis of the projection optical system 50 under control of the controller 70. The wafer stage 60 includes an XY stage for scanning the wafer W in ±X directions, and a Z stage for positioning the wafer in the Z direction.

The detecting system 40 is arranged between the reticle R and the projection optical system 50. The instant embodiment does not incorporate the detecting system 40 into the reticle stage 30.

Figure 4:
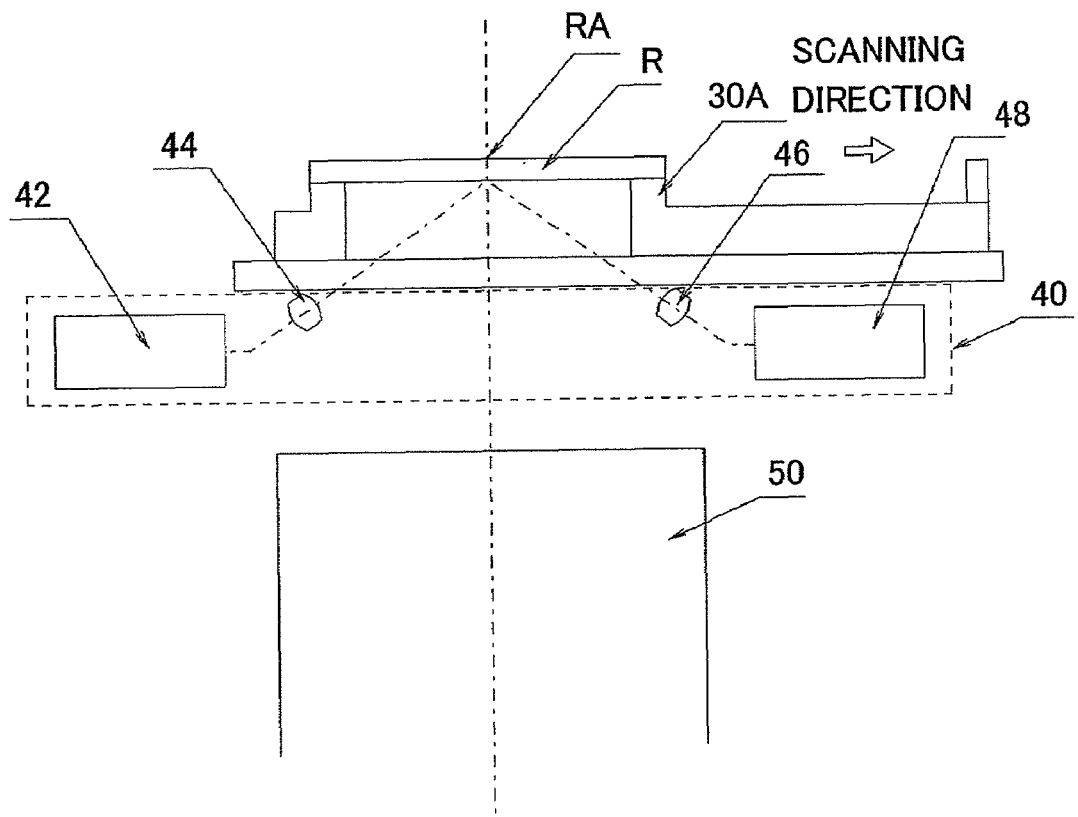
FIG. 4 is an enlarged perspective view near a reticle stage shown in FIG. 3.

A description will be given of the detecting system 40 with reference to FIG. 4. Similar to the first embodiment, the light irradiation section (including the light source, the projection-mark slit, and the projected lens) irradiates the detecting light obliquely onto the reticle pattern surface as a detected surface, and the detector receives the light reflected on the detected surface via a light-receiving lens. The positional information of the detected surface in the Z direction (or the optical-axis direction of the projection optical system 50) can be obtained from the incident position on the detector. While FIG. 4 shows only one system, the deformation amount and inclination of the reticle R in the slit's longitudinal direction (or the direction perpendicular to the scanning direction) etc. can be calculated by projecting plural rays onto plural detected points on the reticle R (or a detected surface) which are arranged in a direction approximately orthogonal to the scanning direction, by receiving the reflected rays from the detected points, and by detecting positions of the detected points in the Z direction. The positional information of the plural measured points in the Z direction in the scanning direction can also be obtained by scanning the reticle R. These pieces of positional information enable the two-dimensional surface shape of the pattern surface of the reticle R to be calculated.

Figure 5A:
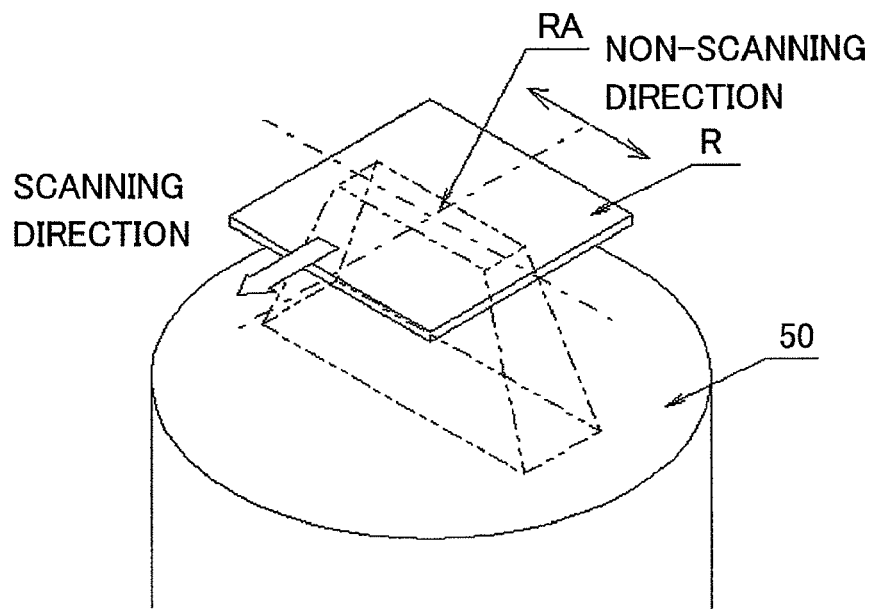
FIG. 5 is a perspective view for explaining a relationship between a detecting system and an illuminated area shown in FIGS. 3 and 4.
Figure 5B:
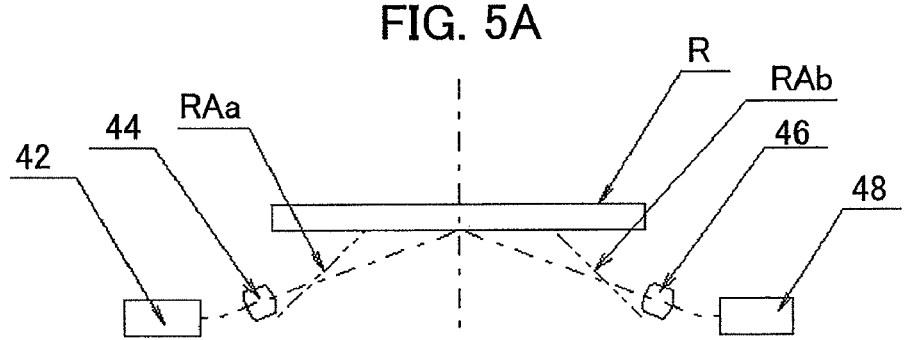
Figure 5C:
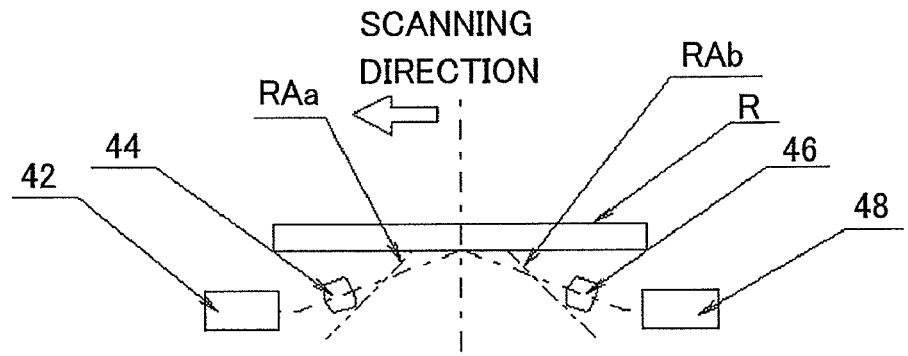

If there are fluctuations on the optical path of the detecting light of the detecting system 40 in this process, an uneven refractive index distribution causes the erroneous detection of the light-receiving part. In order to prevent this problem, the instant embodiment arranges, as shown in FIG. 5C, the detecting system 40 under the reticle R so as to irradiate the detecting light in a direction substantially parallel to the width direction (or scanning direction) of the illuminated area RA, where whether it is "parallel" is determined by a view from a direction perpendicular to the reticle or from an optical-axis direction. Here, a prismoid space enclosed by two-dotted line in FIG. 5A is an exposure-light space in which the exposure light that has information of the reticle's pattern passes through. When the detecting system of the instant embodiment is located in this space, the detecting system would shield the exposure light. Therefore, the detecting system should be arranged outside the exposure-light space. In order to avoid this exposure-light space and shorten the optical-path length of the detecting light, the instant embodiment irradiates the detecting light obliquely onto the reticle R, as shown in FIG. 5C, in a direction substantially parallel to the width direction (or direction perpendicular to the longitudinal direction) of the slit of the slit-shaped illuminated area, where whether it is "parallel" is determined by a view from a direction perpendicular to the reticle or from an optical-axis direction.

When the detecting light is incident so obliquely that it is parallel to another direction, for example, the longitudinal direction (non-scanning direction) of the illuminated area RA as shown in FIG. 5A, the detecting system 40 should be arranged so that the projection lens 44 and the light-receiving lens 46 do not shield the rays RAa and RAb (which pass the outer periphery of the above exposure-light space), and causing the long optical-path length of the detecting light.

In other words, the deteriorations of the measurement accuracy due to the fluctuations are restrained by irradiating the detecting light substantially parallel to the slit's width direction and oblique to the reticle R's surface.

In order to reduce the influence of the refractive index variability due to the fluctuation, the air on the optical path of the detecting light should be less affected by the surrounding space(s). Therefore, the projection lens 44 and the light-receiving lens 46 are preferably located close to the reticle pattern surface without shielding the reticle pattern image of the exposure light.

While the instant embodiment arranges the detecting system 40 under the reticle R, the detecting system 40 can be located above the reticle R if it cannot be located between the reticle R and projection optical system 50.

While the instant embodiment arranges the detecting system 40 so that the incident direction of the detecting light upon the pattern surface of the reticle R is parallel to the width direction (or scanning direction) of the illuminated area RA, the detecting system 40 can be arranged so that the incident direction of the detecting light upon the pattern surface of the reticle R is not parallel to but is inclined to the width direction (or scanning direction) of the illuminated area RA if the optical-path length of the detecting light can be shortened.

While the instant embodiment applies the present invention to the rectangular illuminated area RA, the present invention is applicable to the arc-shaped illuminated area RA to achieve similar effects.

The operations of the detecting system 40 and the exposure apparatus 100A in the instant embodiment are similar to those discussed for the exposure apparatus 100, and a description thereof will be omitted. Thus, the instant embodiment advantageously reduces the influence of the fluctuations on the optical path of the detecting light in the detecting system of the reticle surface position and obtains the accurate and stable reticle pattern image.

Third Embodiment

Figure 6:
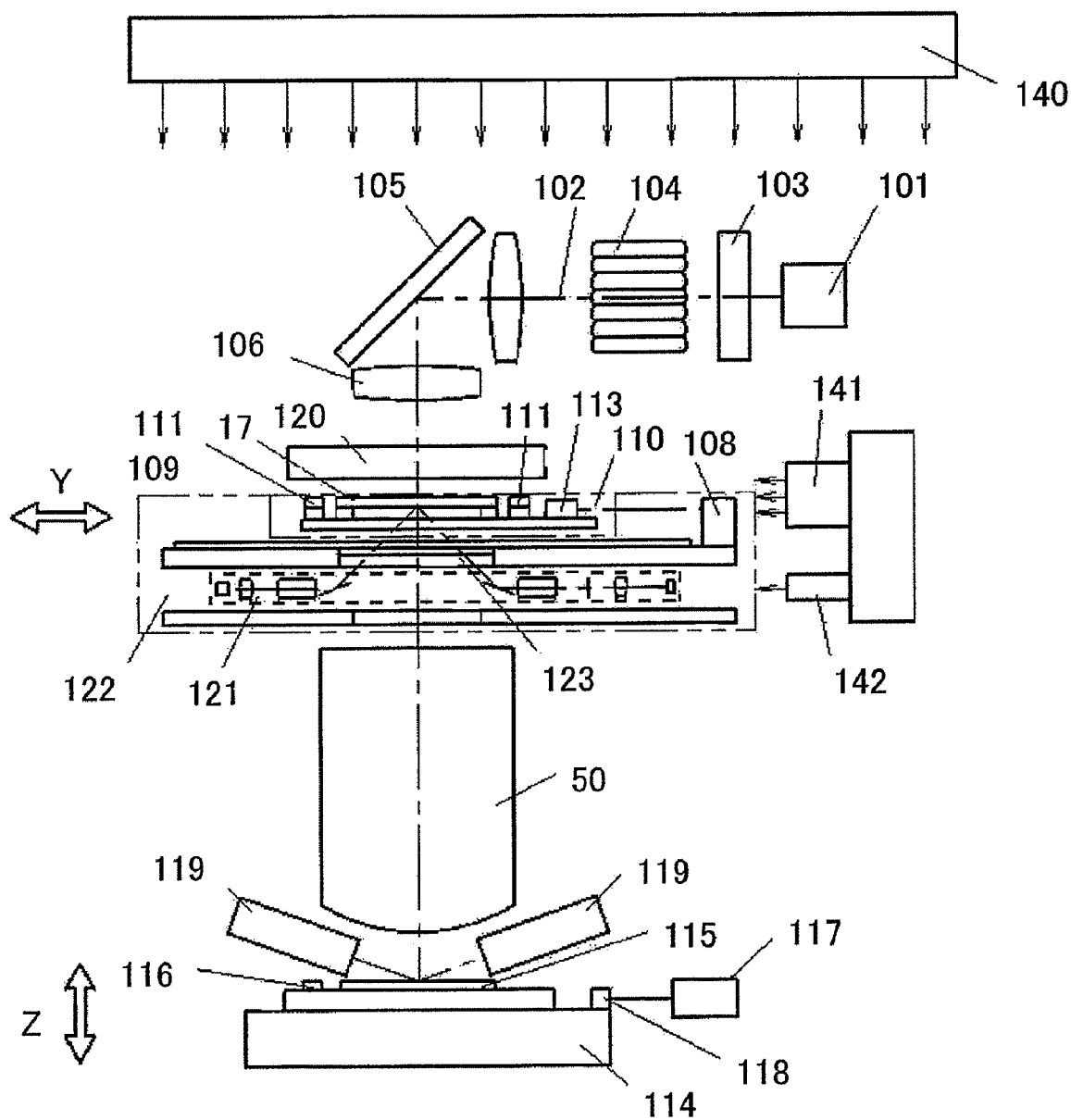
FIG. 6 is a schematic sectional view of an exposure apparatus according to a third embodiment of the present invention.

A description will now be given of an exposure apparatus 100B according to a third embodiment of the present invention, with reference to FIGS. 6 to 15. Here, FIG. 6 is a schematic sectional view of an exposure apparatus 100B. In FIG. 6, a light source 101 emits illumination light 102 with a predetermined wave range. The light source 101 can use the exposure illumination light in the ultraviolet range that has been currently reduced to practice as i-line (with a wavelength of 365 nm), a KrF excimer laser beam (with a wavelength of 248 nm), an ArF excimer laser beam (with a wavelength of 193 nm). The light source 101 may use a light source, such as a $F_2$ laser (with a wavelength of 157 nm), EUV, and a soft-X-ray.

The illumination light 102 from the light source 101 reaches a fly-eye lens 104 after its light diameter is set to the predetermined size by an illumination light shaping optical system 103. Many secondary light sources are formed on an exit surface of the fly-eye lens 104. The illumination light 102 from these secondary light sources reaches a condenser lens 106 via a mirror 105, and illuminates a pattern area an original form 17 (which is a reticle or a mask) at a uniform light intensity.

The original form 17 is absorbed by and held on an original-form stage movable part 110 on an original-form stage 109. A drive control means (not shown) and a laser interferometer 108 control driving of the original-form stage 109 in a Y direction as shown. The original form 17 is scanned in a scanning direction or the Y direction with the original-form stage movable part 110.

A reference original-form 111 is fixed near the original form 17 in a predetermined range on the original-form stage 109. A reflective surface of the reference original-form 111 is approximately level with that of the original form 17, and includes plural original-form reference marks made of a metal surface, such as Cr and Al. The number of reference plates 111 is not limited to one in the inventive exposure apparatus, and plural reference plates 111 may be provided as illustrated.

The original-form stage 109 is driven while a position in the Z direction as illustrated is maintained to be substantially constant relative to the projection optical system 50. A movable mirror 113 that reflects a beam from the laser interferometer 108 is fixed on the original-form stage 109. The laser interferometer 108 sequentially measures a position and a moving amount of the original-form stage 109. Plural laser interferometers 108 are provided to detect positional information in plural directions, instead of only one direction.

A pattern on the original form 17 is imaged and exposed onto a plate 115, such as a wafer, held on a plate stage 114, via an illumination optical system for exposure that includes an illumination-light shaping optical system 103, the fly-eye lens 104, the mirror 105, the condenser mirror 106, etc., and the projection optical system 50.

A reference plate 116 is fixed near the plate 115 in a predetermined range of the plate stage 114. A reflective surface of the reference plate 116 is approximately level with that of the plate 115, and includes plural reference marks made of a metal surface, such as Cr and Al. The number of reference plates 116 is not limited to one in the inventive exposure apparatus 100B, and plural reference plates 116 may be provided as illustrated.

The plate stage 114 is provided with a drive control means (not shown) for longitudinal driving, image-surface blur correcting driving, alignments of the plate 115 or reference plate 116, and rotational driving of the plate 115 and reference plate 116 at the yawing control time in order to position the plate 115 on the image surface of the projection optical system 50. A movable mirror 118 for reflecting a beam from a laser interferometer 117 is fixed on the plate stage 114. The laser interferometer 117 sequentially measures a position and a moving amount of the plate stage 14.

This configuration enables the plate stage 114 to move in the optical-axis direction (or the Z direction) of the projection optical system 50, and in the plane (or the X-Y plane) orthogonal to the optical-axis direction. In addition, the plate stage 114 can rotate around the optical axis (in the θ direction).

The original form 17 and the plate 115 are located optically conjugate with each other with respect to the projection optical system 50 and plural position detecting means, and the illumination optical system illuminates a slit-shaped or arc-shaped exposure area on the original form 17 in the non-scanning direction (or X direction). The exposure area on the original form 17 causes the slit-shaped exposure area to be formed on the plate 115 with a size proportional to the projection magnification of the projection optical system 50.

An off-axis position detecting means is provided above the plate 115, and detects an alignment mark on the plate. The detection information is processed by a controller and sent to a main control system. The main control system controls positioning actions and scanning actions of the plate stage 114.

The exposure apparatus 100B drives, relative to the exposure optical axis, both the original-form stage 109 and the plate stage 114 at a speed ratio corresponding to the optical magnification of the projection optical system, and achieves the scanning exposure by scanning the exposure areas on the original form 17 and the plate 115.

The exposure apparatus 100B includes a plate surface position detecting means 119 of an oblique incidence manner. The plate surface position detecting means 119 irradiates non-exposure light oblique to the plate 115, on which a pattern of the original form 17 is transferred by the projection optical system 50, (or the reference plate 116), and detects the obliquely reflected light from the plate 115 surface or the reference plate 116 surface. The detector section of the plate surface position detecting means 119 includes plural light-receiving elements for detecting positions, and a light-receiving surface of each position detecting light-receiving element and each reflecting point on the plate 115 are arranged substantially conjugate with each other. Therefore, a positional offset of the plate 115 or reference plate 116 with respect to the optical-axis direction of the projection optical system 50 is measured as a positional offset of the light-receiving element for detecting positions in the detector section.

However, when the projection optical system 50 absorbs the exposure heat or surrounding ambient varies, a focus position of the projection optical system 50 varies and an error occurs between the measurement origin and the focus surface of the plate surface position detecting means 119. Therefore, the TTR position detecting means 120 is provided to calibrate this error.

The TTR position detecting means 120 obtains substantially the same light as the exposure light from the illumination optical system for exposure, and introduces it via a fiber or lens optical system. The introduced light illuminates a focus mark on the reference original-form 111. At least one optical system in the TTR position detecting means 120 is driven in the optical-axis direction of the detecting light, and the detected focal surface of the TTR position detecting means 120 is corresponded to the focus mark on the reference original-form 111. Next, the plate surface position detecting means 119 drives the plate stage 114 longitudinally in the optical-axis direction (or Z direction) near the preset zero point. During the driving, the reference plate 116 is located approximately below the projection optical system 50. The light that has passed through the focus mark on the reference original-form 111 transmits the projection optical system 50, and illuminates the reference plate 116. The light reflected on the reference plate 116 transmits through the projection optical system 50 again, and enters the light-receiving part of the TTR position detecting part 120 via the reference original-form 111. This measurement detects the focus position of the reference plate 116, and calibrates the measurement origin of the plate surface position detecting means 119.

Figure 8:
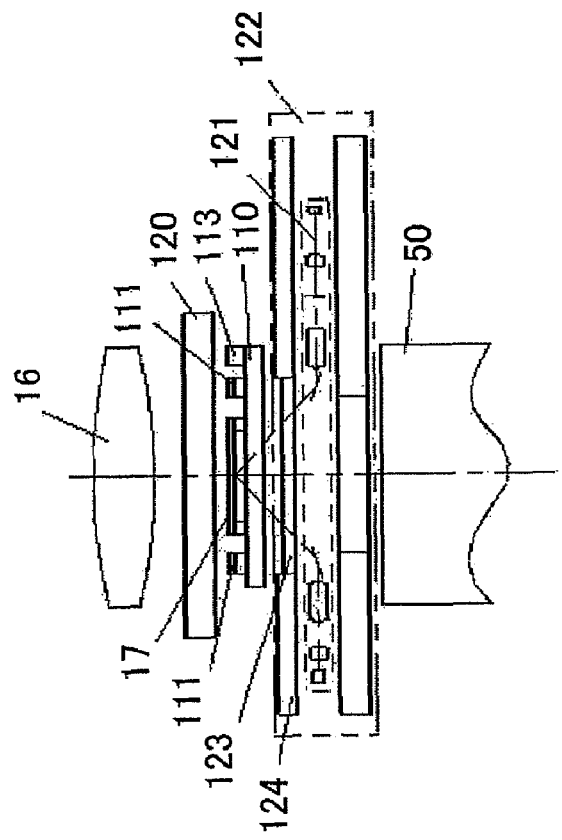
FIG. 8 is a schematic side view around an original-form surface-position detecting means according to a third embodiment of the present invention.
Figure 7:
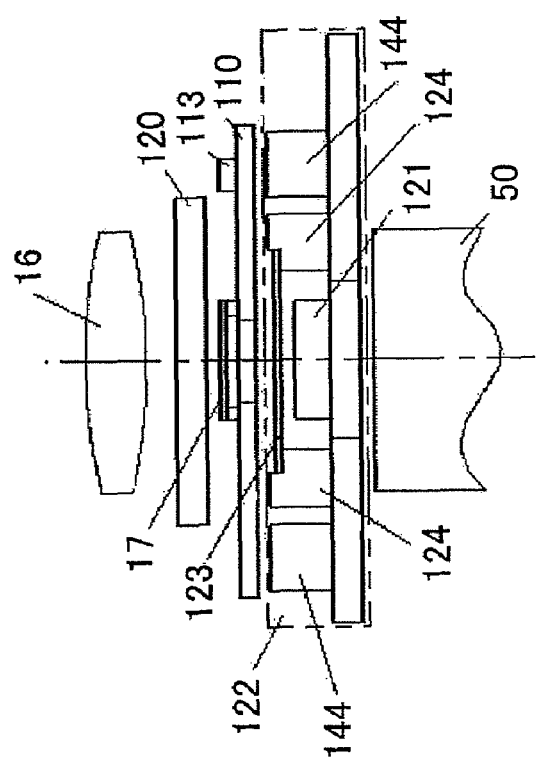
FIG. 7 is a schematic plane view around an original-form surface-position detecting means according to a third embodiment of the present invention.

The exposure apparatus 100B includes an original-form surface-position detecting means 112 of an oblique incidence. FIG. 7 is a schematic plane view around the original-form surface-position detecting means 121 according to the third embodiment of the present invention. FIG. 8 is a schematic structure of a side periphery of the original-form surface-position detecting means 121 according to a third embodiment of the present invention.

The original-form surface-position detecting means (or detecting system) 121 is located under the scanning range at least one of the original form 17 and the reference original-form 111, and located above the projection optical system 50. The original-form surface-position detecting means 121 is fixed on the original-form stage non-movable part 122 in a range that does not interfere with the scanning range of the original-form stage movable part 109.

The instant embodiment defines the range of the original-form surface-position detecting means 121 as follows: The exposure apparatus 100B includes the original-form stage guides 144 at both sides of the projection optical system 50, and arranges the original-form surface-position detecting means on the original-form stage non-movable part 122 between the original-form stage guides 144. This structure takes advantage of the arrangement space, even if the space is narrow between the original-form stage and the projection optical system 50, since the original-form stage and the original-form surface-position detecting means 121 are not formed separately.

An optical element 123 and a shielding member 124 for separating a space that encloses the original-form surface-position detecting means 121 and a space that encloses the original-form stage movable part 110, are formed between the original-form surface-position detecting means 121 and the original-form stage movable part 110. The optical element 123 is located on the optical paths of the exposure light and the light of the original-form surface-position detecting means 121 and the TTR position detecting means 120. The shielding member 124 is located outside the range of the light, and serves to substantially separate the space of the original-form surface-position detecting means 121 from the space of the original-form stage movable part 110. The "range of the light" in the instant embodiment is not limited to the effective range of the light, but means a range that includes an arbitrary margin in addition to the effective range of the light. The shielding member 124 may be an optical element, but may preferably use metal or resin for purposes of the cost, adiabatic effect, and structural simplicity, etc.

Figure 11:
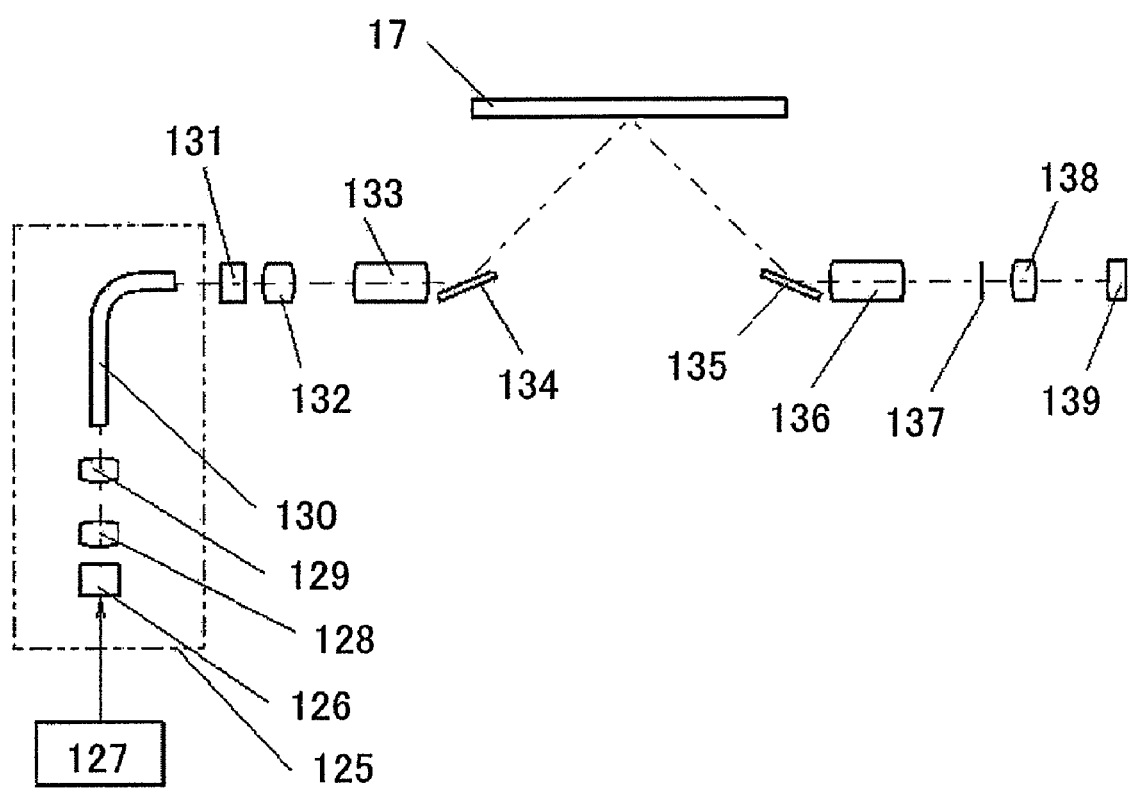
FIG. 11 is a schematic sectional view of the original-form surface-position detecting means.

A description will now be given of each element in the original-form surface-position detecting means 121. In FIG. 11, 125 is a light source section for the original-form surface-position detecting means. 126 is an emitting light source for detecting an original-form surface position. 127 is a drive circuit, and adapted to arbitrary control the light intensity emitted from the emitting light source 126.

The light emitted from the emitting light source 126 is introduced into a light transmission means 130, such as an optical fiber, via a collimator lens unit 128, and a condenser lens unit 129.

The light emitted from the light transmission means 130 illuminates a slit 132 via an illumination lens unit 131. A mark for detecting a surface position of the original-form pattern surface is formed on the slit 132, and projected onto the original-form pattern surface as a detected surface via a mirror 134 via an imaging lens unit 133. The imaging lens unit 133 arranges the slit 132 and the original-form pattern surface optically conjugate with each other. The light based on the mark image imaged on the original-form pattern surface is reflected on the original-form pattern surface, and the mirror 135 and the imaging lens unit 136 re-form the mark image on the re-imaging position 137. An enlargement optical system 138 condenses the light re-formed on the re-imaging position 137, and substantially images it on a position-detecting light-receiving element 139. A signal from the light-receiving element 139 is processed by the original-form surface-position signal processing system, as the surface position information of the original-form pattern surface as the detected surface in the Z direction, and the inclination information.

While FIG. 11 is a schematic sectional view and shows only one system, the present invention is not limited to one system and plural systems.

A description will now be given of a basic detection principal of the original-form surface position detecting means 121. The detection method includes the steps of irradiating light obliquely onto the original-form pattern surface as the detected surface, detecting the incident position upon a predetermined surface of the light reflected on the detected surface, and detecting the surface position information of the detected surface in the Z direction based on the detected surface. While the instant embodiment describes only one detection system, the actual system projects, onto plural measurement points on the detected surface, plural rays set in a direction substantially orthogonal to the scanning direction, and calculates the inclination information of the detected surface using the surface position information in the Z direction obtained at each measurement point. In addition, the surface position information in the Z direction can be measured at plural measurement points in the scanning direction by scanning the original form. The surface position information enables a pattern surface shape of the original form to be calculated.

The light incident direction of the original-form surface-position detecting means 121 is aligned with the scanning direction of the original form stage movable part 110. The original-form surface-position detecting means 121 is located on the original-form stage non-movable part 122 between the original-form stage guides 144, and the scanning direction of the original-form stage movable part 110 is substantially parallel to the original-form stage guide 144. The arrangement space of the original-form surface-position detecting means 121 has allowance in an original-form stage scanning direction. In other words, a simple and efficient arrangement by arranging the original-form surface-position detecting means 121 in the scanning direction of the original-form stage movable part 110. In addition, since there are no or few intersections with the original-form stage guides 144 or electric components, the original-form surface-position detecting means 121 can be arranged efficiently and simply.

The exposure apparatus 100B arranges the original-form surface-position detecting means 121 under the scanning range of the original form or reference original-form, and the surface-position detecting position of original-form surface-position detecting means 121 for the original form or reference original-form may be measured along the optical axis of the projection optical system or near the optical axis for exposure light as shown in FIG. 8. In other words, the precise surface position information can be obtained by arranging a detecting position apart from the optical axis for exposure, because the projection optical system is not affected by the aberration of the projection optical system, such as distortion.

The exposure apparatus 100B is housed in a clean chamber so as to prevent dust from adhering to the original form and plate, and the clean chamber has an air-conditioning mechanism that maintains the internal temperature constant so as to eliminate the influence of the heat from the heating source attached to the projection exposure apparatus. The air-conditioning mechanism includes an air-conditioning mechanism 140 that forms a laminar flow or turbulence of the air at an approximately constant temperature from down to top, an air-conditioning mechanism 141 for providing the airflow in a horizontal direction near the original-form stage 109, and an air-conditioning mechanism 142 for providing the airflow in a horizontal direction near the original-form surface-position detecting means 121, etc. The air-conditioning mechanisms 140 to 142 are not limited to the above airflows, and various airflows of various directions can be applied. This structure can reduce the influence of the mechanical deformations and air fluctuations in the projection optical system, and maintain the optical accuracy satisfactorily.

The exposure apparatus 100B arranges the optical element 121 or shielding member 124 for separating the space near the original-form surface-position detecting means 121 from the space near the original-form stage movable part 110, between the original-form surface-position detecting means 121 and the original-form stage movable part 110. Therefore, it is possible to individually air-condition at least one of the neighborhoods of both the original-form surface-position detecting means 121 and the original-form stage movable part 110. The air-conditioning mechanisms 141 and 142 may be ducted by the same air-conditioning mechanism, or individually ducted by separate air-conditioning mechanisms. The air-conditioning mechanism is not limited to the above structure, but may have various structures within the scope of the present invention, as long as the air-conditioning of the space near the original-form stage movable part 110 does not affect or less affects the space near the original-form surface-position detecting means 121.

Fourth Embodiment

Figure 10:
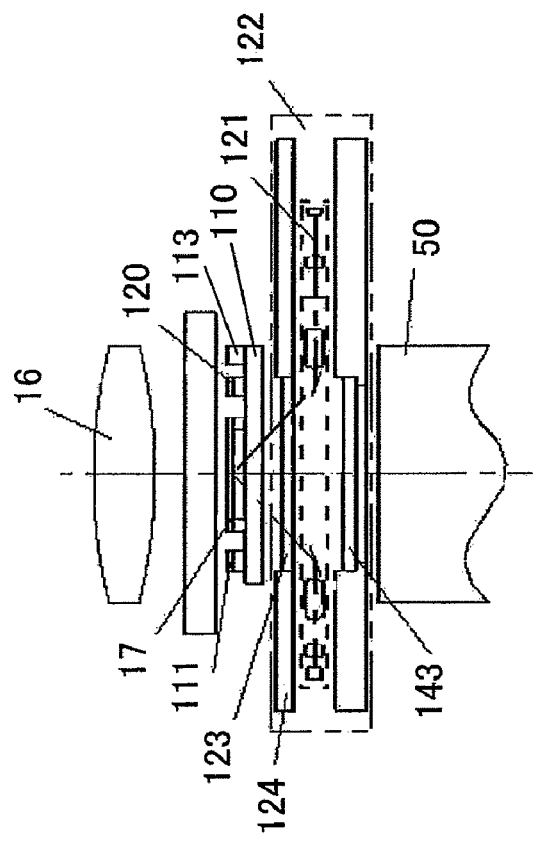
FIG. 10 is a schematic side view around an original-form surface-position detecting means according to a fourth embodiment of the present invention.
Figure 9:
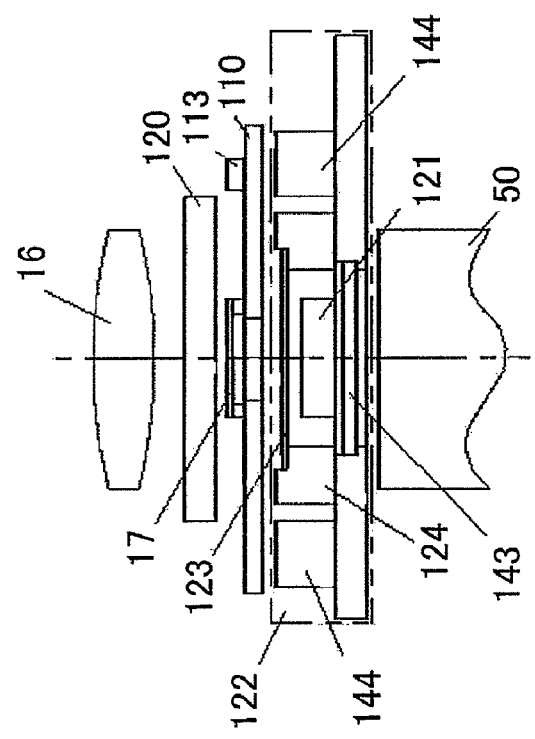
FIG. 9 is a schematic plane view around an original-form surface-position detecting means according to a fourth embodiment of the present invention.

FIG. 9 is a schematic structure of a front peripheral of an original-form surface-position detecting means 121 according to a fourth embodiment of the present invention. FIG. 10 is a schematic structure of a side peripheral of an original-form surface-position detecting means 121 according to the fourth embodiment of the present invention.

The fourth embodiment is different from the third embodiment in that a space that encloses the original-form surface-position detecting means 121 is substantially separated from a space that encloses the projection optical system 50.

According to the instant embodiment, in a range where the exposure light or the light of the TTR position detecting means 120 or TTL position detecting means (not shown) transmits or reflects, an optical element 143 separates the above two spaces from each other, and a shielding member made of metal, resin, etc. separates the above two spaces from each other outside the above range. Use of metal, resin, etc. for the shielding member outside the above range is preferable in view of cost, adiabatic effect, easy structure, etc., but an optical element may be used instead if use of the optical element is permissible in view of the detection performance, etc.

Fifth Embodiment

Figure 13:
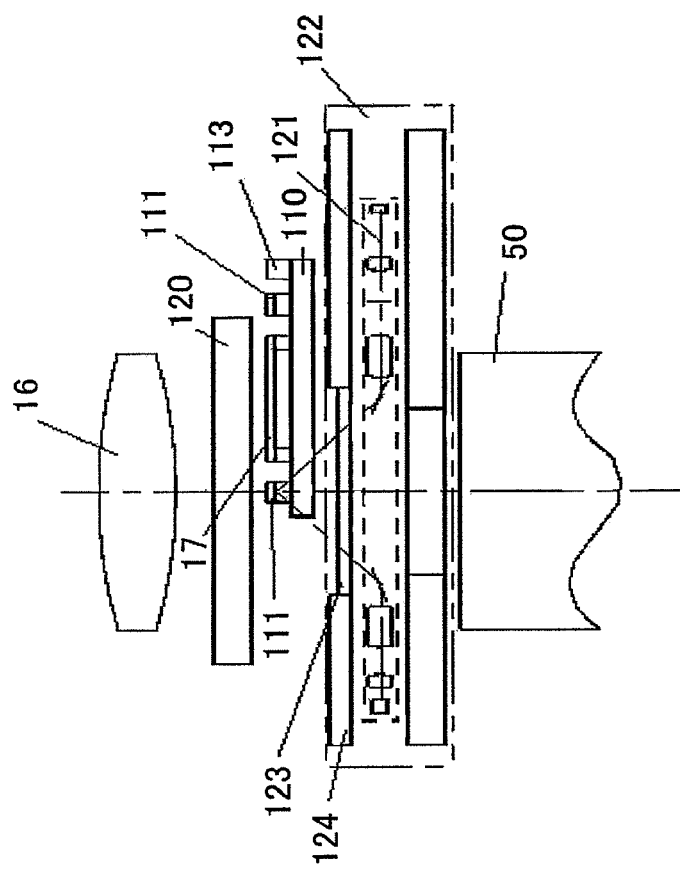
FIG. 13 is a schematic side view around an original-form surface-position detecting means according to a fifth embodiment of the present invention.
Figure 12:
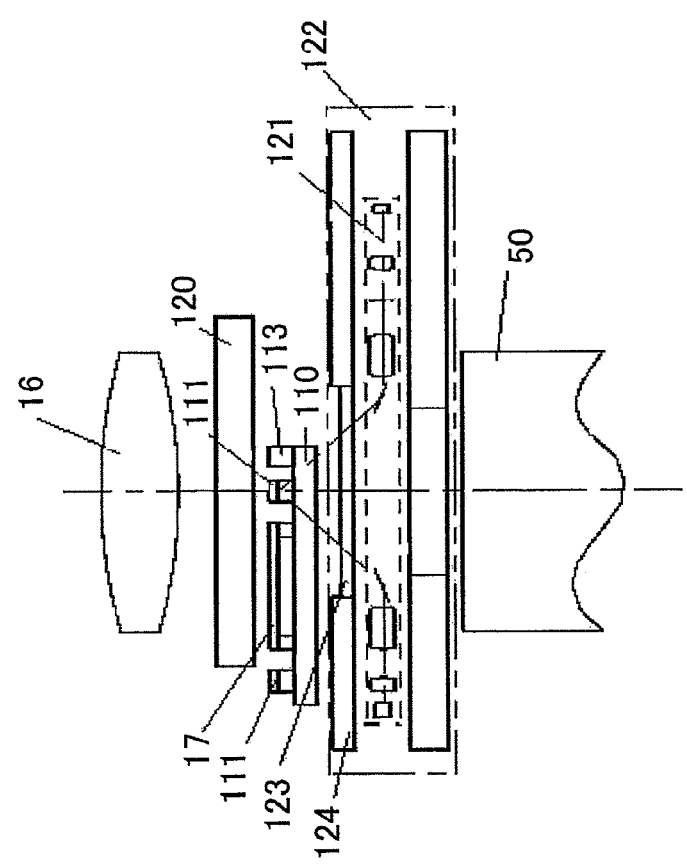
FIG. 12 is a schematic plane view around an original-form surface-position detecting means according to a fifth embodiment of the present invention.

FIGS. 12 and 13 show a fifth embodiment of the present invention. The instant embodiment uses the original-form surface-position detecting means 121, drives the original-form stage, and obtains surface position information of the reference original-form 111.

The above first to fifth embodiments may be arbitrarily combined within a scope of the present invention.

While the first to fifth embodiments addresses to the scanning exposure apparatus, the present invention is, of course, applicable to a step-and-repeat type exposure apparatus (or a stepper).

While the light incident upon the detected surface, such as the reticle R from the detecting system is substantially parallel to the scanning direction of the reticle R in the first to fifth embodiments, the light incident upon the detected surface can be inclined to the scanning direction, as shown in FIG. 16. Here, the term "inclined" means that it is inclined relative to the scanning direction viewed from the optical-axis direction (or a direction perpendicular to the reticle as the detected object).

The first to fifth embodiments provide detected points symmetrically on the reticle as the detected surface, with respect to the slit's longitudinal direction as shown in FIG. 17A. If the reticle as the detected surface deforms substantially symmetrically, the detected points on the detected surface may be set aside on one of half surfaces with respect to the slit's longitudinal direction. For example, even two detected points shown in FIG. 17B can provide similar effects to FIG. 17A, and an arrangement of the detected points as shown in FIG. 17C allows three detected points at one side with respect to the slit's longitudinal direction. Thus, the detection accuracy of the reticle's deformations improves.

Sixth Embodiment

Figure 14:
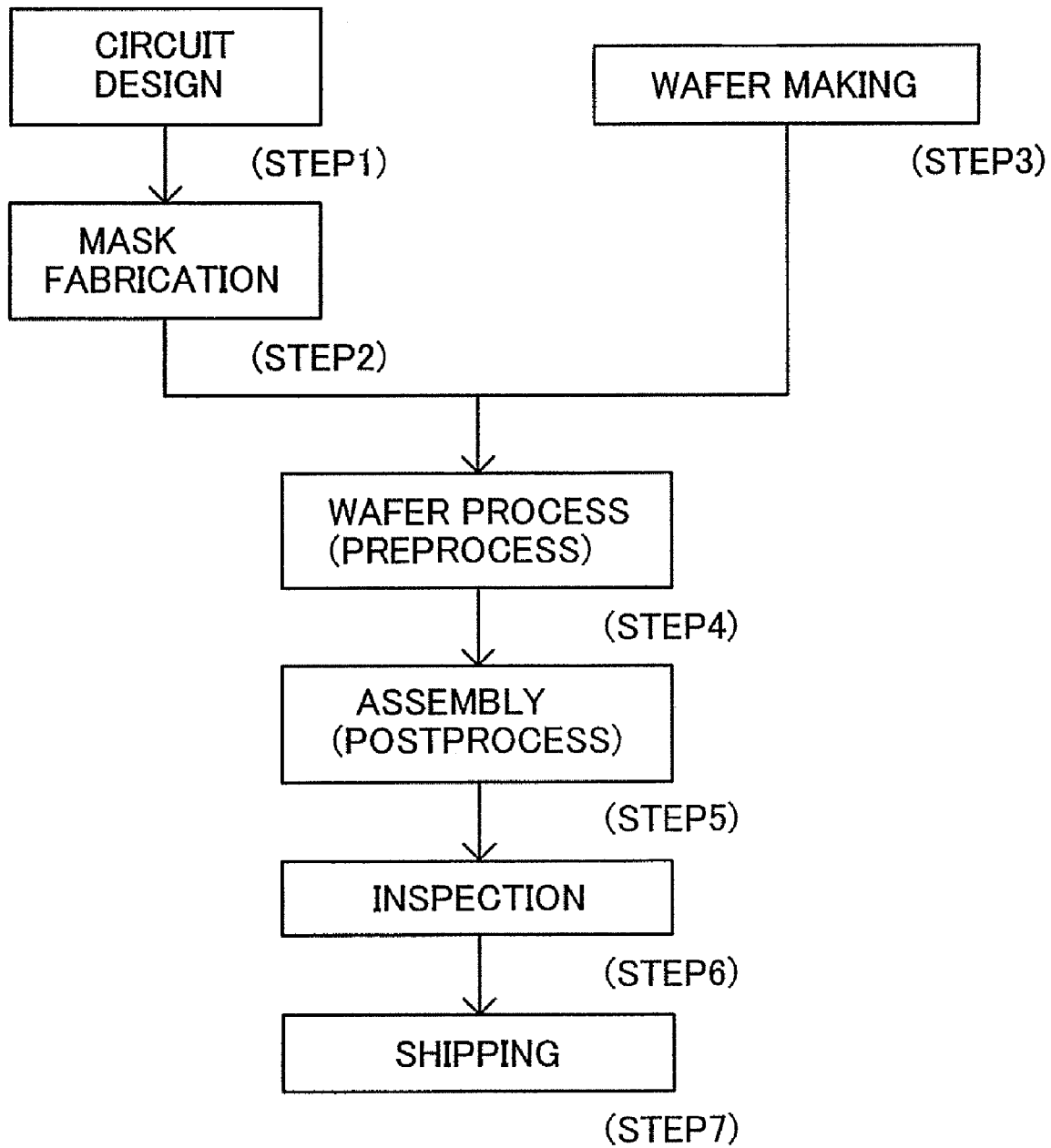
FIG. 14 is a flowchart for explaining manufacturing of devices (such as semiconductor chips like ICs, LSIs, and others, LCDs, CCDs, and the like).
Figure 15:
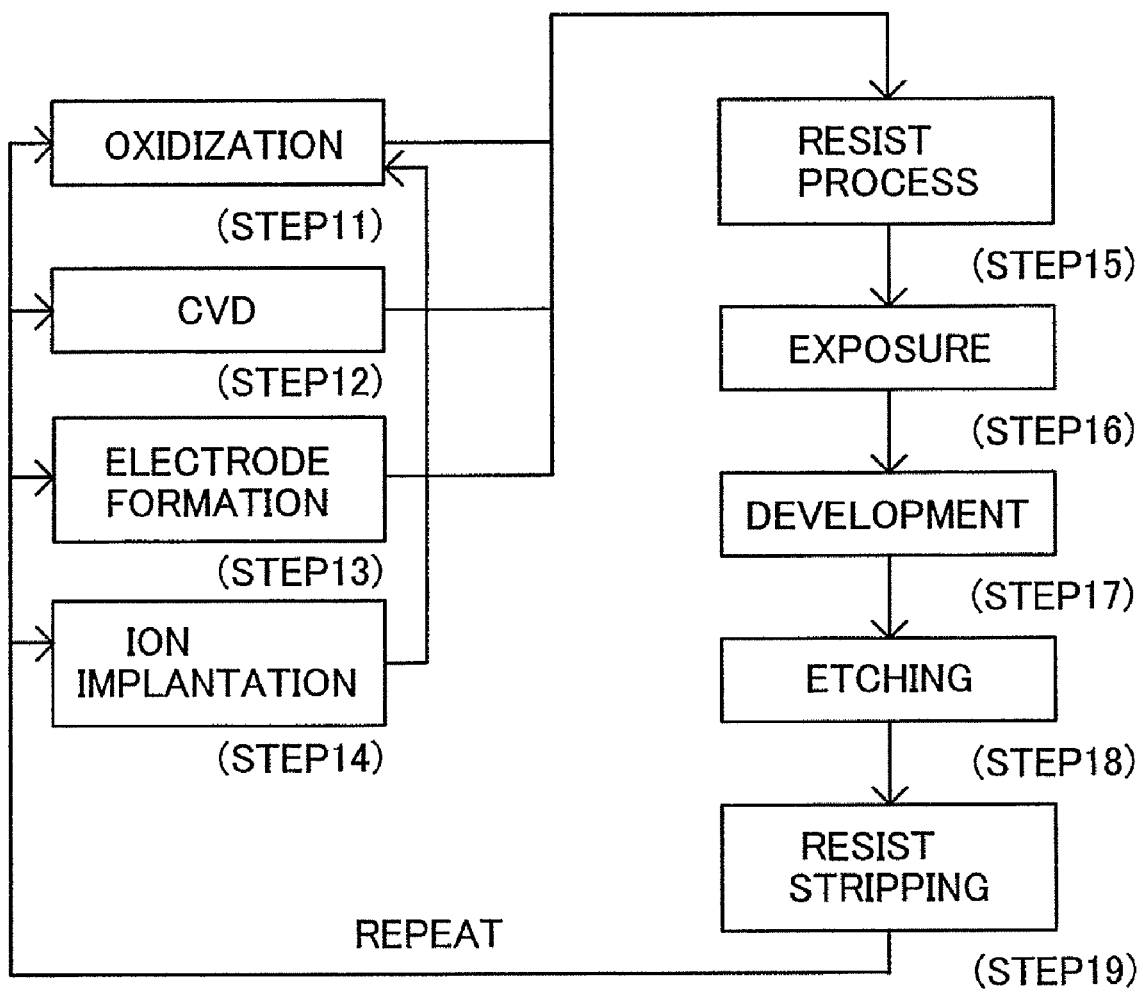
FIG. 15 is a detailed flowchart for the wafer process of Step 4 shown in FIG. 15.

Referring now to FIGS. 14 and 15, a description will be given of an embodiment of a device fabrication method using one of the above scanning exposure apparatuses 100, 100A and 100B. FIG. 14 is a flowchart for explaining the way of fabricating devices (e.g., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms actual circuitry on the wafer through lithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 15 is a detailed flowchart of the wafer process in Step 4. Step 11 (oxidation) oxidizes the wafer's surface. Step 12 (CVD) forms an insulating layer on the wafer's surface. Step

13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than the conventional method.

Further, the present invention is not limited to these preferred embodiments and various variations and modifications may be made without departing from the scope of the present invention.

Thus, the present invention can provide a scanning exposure apparatus that exhibits high imaging performance with a simple structure.

What is claimed is:

1. An exposure apparatus comprising:
    a projection optical system for transferring a pattern on an original form onto a photosensitive plate;
    an original-form stage for holding the original form, said original-form stage including a non-movable part and a movable part moving over the non-movable part while holding the original form;
    a surface position detector for obtaining information about surface positions of the original form, said surface position detector being incorporated into the non-movable part;
    an optical element for separating a first space that encloses said surface position detector from a second space that encloses the movable part, said optical element being arranged between said surface position detector and the movable part; and
    an air-conditioner mechanism for individually air-conditioning the first space and the second space.

2. An exposure apparatus according to claim 1, wherein said surface position detector obtains information about surface positions of the original form in an optical-axis direction of said projection optical system, and includes an oblique incidence optical system for irradiating light oblique to the optical-axis direction of said projection optical system, onto a pattern surface of the original form at a side of said projection optical system, an incident direction of the irradiated light being substantially parallel to a moving direction of the movable part of said original-form stage.

* * * * *